United States Patent
Hu et al.

(10) Patent No.: US 6,368,962 B2
(45) Date of Patent: Apr. 9, 2002

(54) SEMICONDUCTOR PROCESSING METHOD OF FORMING A CONDUCTIVE LINE, AND BURIED BIT LINE MEMORY CIRCUITRY

(75) Inventors: Yongjun Jeff Hu; Pai-Hung Pan; Scott Jeffrey DeBoer, all of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/827,973

(22) Filed: Apr. 5, 2001

Related U.S. Application Data (62) Division of application No. 09/454,536, filed on Dec. 6, 1999.

(51) Int. Cl.$^7$ ............................................. H01L 49/00
(52) U.S. Cl. .................... 438/653; 438/656; 438/688; 438/652
(58) Field of Search ................................. 438/653, 656, 438/688, 652, 625, 627, 643, 648, 657; 257/310, 303, 304, 305, 306, 530, 529; 428/472, 336, 469

(56) References Cited

U.S. PATENT DOCUMENTS

| | | | |
|---|---|---|---|
| 5,185,211 A | * 2/1993 | Sue et al. | ............. 428/472 |
| 5,187,120 A | 2/1993 | Wang | |
| 5,329,153 A | 7/1994 | Dixit | |
| 5,525,543 A | 6/1996 | Chen | |
| 5,760,476 A | 6/1998 | Cronin et al. | ......... 257/758 |
| 5,834,846 A | * 11/1998 | Shriniki et al. | ......... 257/754 |
| 5,913,145 A | 6/1999 | Lu et al. | |
| 5,985,759 A | 11/1999 | Kim et al. | |
| 6,004,729 A | * 12/1999 | Shinriki et al. | ......... 43/625 |
| 6,028,003 A | * 2/2000 | Frisa et al. | ............. 438/653 |
| 6,093,638 A | 7/2000 | Cho et al. | |
| 6,147,405 A | * 11/2000 | Hu | ...................... 257/755 |
| 6,159,851 A | 12/2000 | Chen et al. | |
| 6,174,798 B1 | 1/2001 | Hsia et al. | |
| 6,198,144 B1 | * 3/2001 | Pan et al. | ............. 257/412 |
| 6,215,144 B1 | * 4/2001 | Saito et al. | ............. 257/310 |
| 6,245,631 B1 | 6/2001 | Argarwal et al. | |
| 6,337,274 B1 | * 1/2002 | Hu et al. | ............. 438/653 |

FOREIGN PATENT DOCUMENTS

| | | | | |
|---|---|---|---|---|
| JP | 02000311871 | | 11/2000 | ............. 21/285 |
| JP | 2000311871 | * | 11/2000 | ............. 21/285 |

OTHER PUBLICATIONS

U.S. application No. 09/259,216, Hu et al., filed Feb. 19, 1998.
U.S. application No. 09/259,216, Hu et al., filed Mar. 1, 1999.
U.S. application No. 09/260,237, Hu et al., filed Mar. 1, 1999.
U.S. application No. 09/454,828, Agarwal et al., filed Dec. 6, 1999.

* cited by examiner

*Primary Examiner*—Keith Christianson
*Assistant Examiner*—Laura M Schillinger
(74) *Attorney, Agent, or Firm*—Wells St. John P.S.

(57) ABSTRACT

The invention includes buried bit line memory circuitry, methods of forming buried bit line memory circuitry, and semiconductor processing methods of forming conductive lines. In but one implementation, a semiconductor processing method of forming a conductive line includes forming a silicon comprising region over a substrate. A $TiN_x$ comprising layer is deposited over the silicon comprising region, where "x" is greater than 0 and less than 1. The $TiN_x$ comprising layer is annealed in a nitrogen containing atmosphere effective to transform at least an outermost portion of the $TiN_x$ layer over the silicon comprising region to TiN. After the annealing, an elemental tungsten comprising layer is deposited on the TiN and at least the elemental tungsten comprising layer, the TiN, and any remaining $TiN_x$ layer is patterned into conductive line. In one implementation, a method such as the above is utilized in the fabrication of buried bit line memory circuitry. In one implementation, the invention comprises buried bit line memory circuitry fabricated by is the above and other methods.

7 Claims, 12 Drawing Sheets

SEMICONDUCTOR PROCESSING METHOD OF FORMING A CONDUCTIVE LINE, AND BURIED BIT LINE MEMORY CIRCUITRY

RELATED PATENT DATA

This patent resulted from a divisional application of U.S. patent application Ser. No. 09/454,536, filed Dec. 6, 1999, entitled "Methods of Forming Buried Bit Line Memory Circuitry" (as Amended), naming Yongjun Jeff Hu, Pai-Hung Pan and Scott Jeffrey DeBoer as inventors, the disclosure of which is incorporated by reference.

TECHNICAL FIELD

This invention relates to buried bit line memory circuitry, to methods of forming buried bit line memory circuitry, and to semiconductor processing methods of forming conductive lines.

BACKGROUND OF THE INVENTION

Semiconductor circuitry fabrication is ever attempting to make denser and smaller circuit components. One type of circuitry where this is occurring is in the design and fabrication of memory circuitry, for example in buried bit line memory circuitry. One type of memory circuitry employing buried bit line architecture is dynamic random access memory (DRAM). Such circuitry typically includes a series of bit lines and word lines wherein at least a majority portion of the capacitors are formed elevationally above or outwardly of the bit lines.

A parasitic capacitance between buried digit lines becomes increasingly problematic as circuitry density becomes greater and circuitry components become smaller. Accordingly, alternate designs and materials are being considered for fabrication of the digit lines in highly dense circuitry fabrication, for example at and below 0.18 micron digit line width.

The invention was motivated from a desire to improve fabrication methods and constructions associated with buried bit line circuitry, and particularly buried bit line DRAM circuitry. However, the artisan will appreciate applicability of the invention to other circuitry fabrication methods and structures, with the invention only being limited by the accompanying claims appropriately interpreted in accordance with the doctrine of equivalents.

SUMMARY

The invention includes buried bit line memory circuitry, methods of forming buried bit line memory circuitry, and semiconductor processing methods of forming conductive lines. In but one implementation, a semiconductor processing method of forming a conductive line includes forming a silicon comprising region over a substrate. A $TiN_x$ comprising layer is deposited over the silicon comprising region, where "x" is greater than 0 and less than 1. The $TiN_x$ comprising layer is annealed in a nitrogen containing atmosphere effective to transform at least an outermost portion of the $TiN_x$ layer over the silicon comprising region to TiN. After the annealing, an elemental tungsten comprising layer is deposited on the TiN and at least the elemental tungsten comprising layer, the TiN, and any remaining $TiN_x$ layer is patterned into conductive line. In one implementation, a method such as the above is utilized in the fabrication of buried bit line memory circuitry. In one implementation, the invention comprises buried bit line memory circuitry fabricated by the above and other methods.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
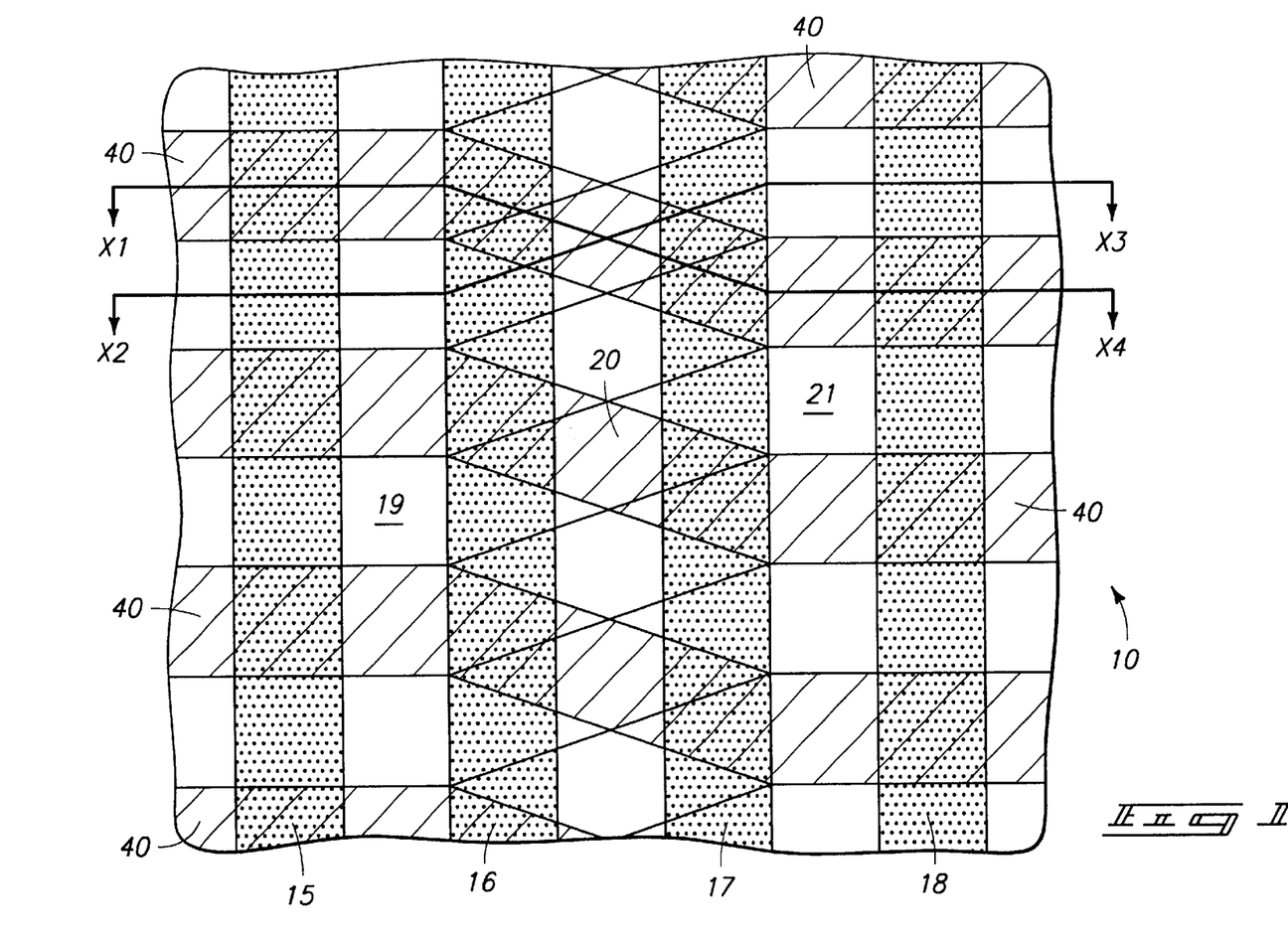
FIG. 1 is a top diagrammatic view of a buried bit line DRAM array in accordance with but one aspect of the invention.
Figure 19:
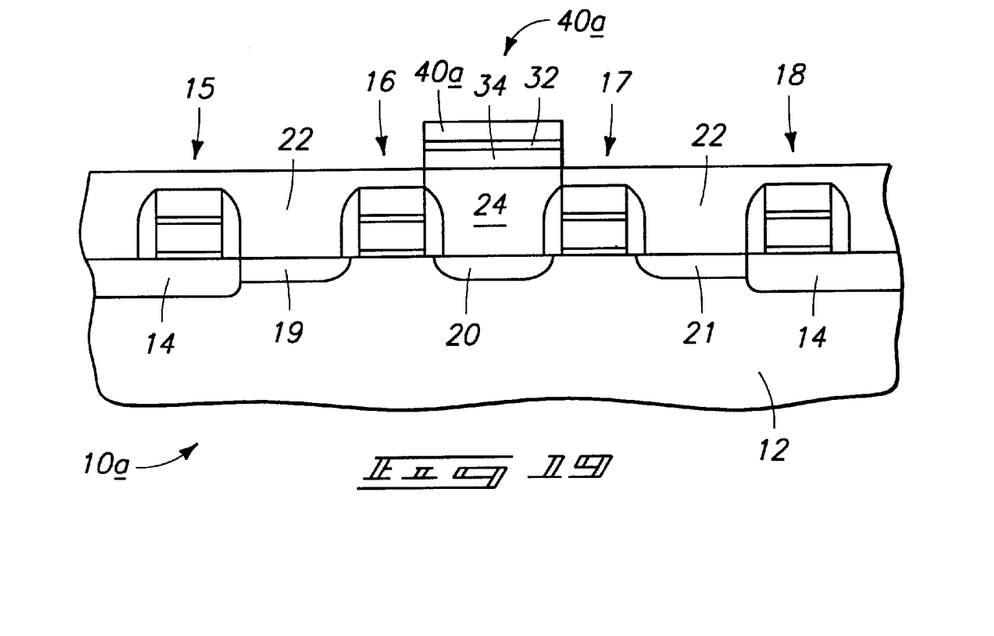
FIG. 19 is a view of the alternate embodiment wafer fragment corresponding in section and sequence to that depicted by FIG. 18.
Figure 20:
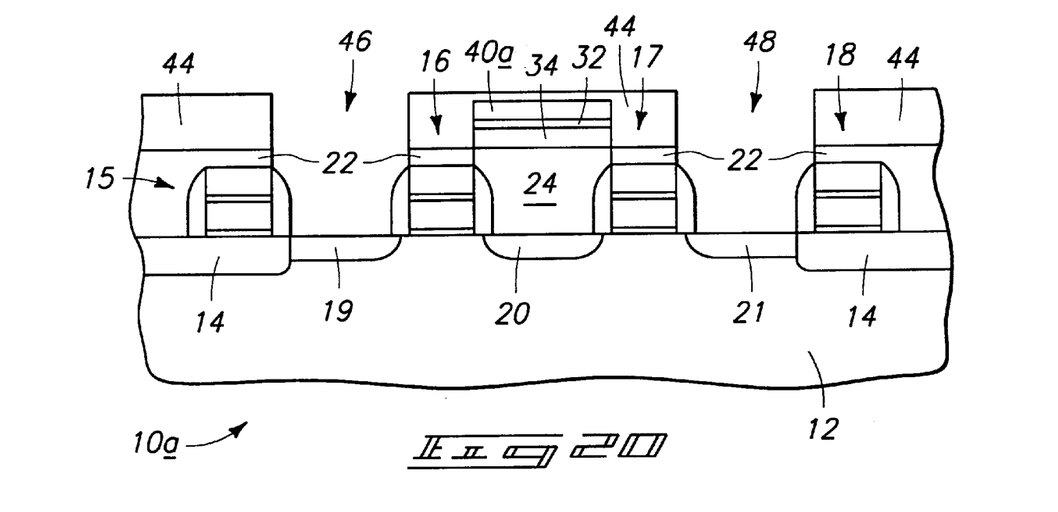
FIG. 20 is a view of the FIG. 19 alternate embodiment wafer fragment at a processing step subsequent to that depicted by FIG. 19.
Figure 21:
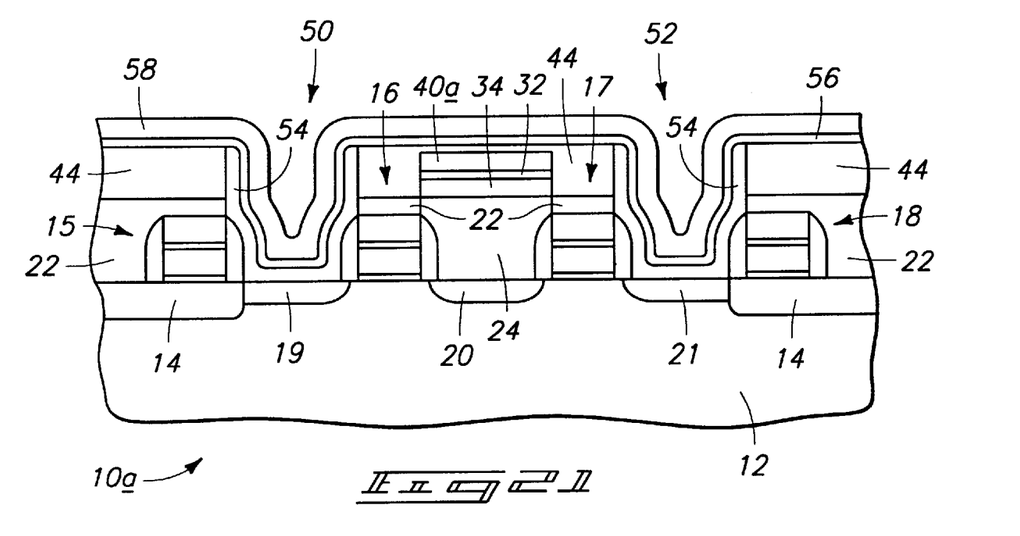
FIG. 21 is a view of the FIG. 20 wafer fragment at a processing step subsequent to that depicted by FIG. 20.
Figure 22:
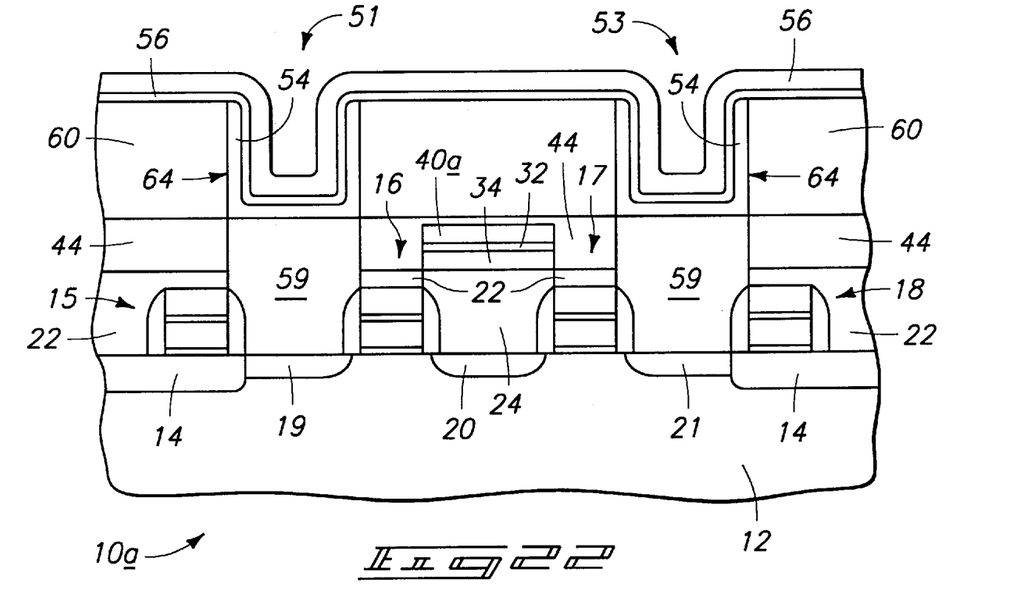
FIG. 22 is an alternate embodiment view of the FIG. 20 wafer fragment at an alternate processing step to that depicted by FIG. 21.

A method of forming buried bit line memory circuitry is described in conjunction with but one exemplary embodiment of forming DRAM buried bit line memory circuitry as depicted in top plan view in FIG. 1. Alternate buried bit line DRAM circuitry, and alternate buried bit line memory circuitry are of course contemplated. The description proceeds with reference to two exemplary preferred embodiments. One of the embodiments sequentially progresses with description relative to FIGS. 2–7, FIG. 10, FIG. 11, FIG. 14, FIG. 15, and FIG. 18. An alternate embodiment is shown and described with reference to FIGS. 2–5, FIG. 8, FIG. 9, FIG. 12, FIG. 13, FIG. 16, FIG. 17, and FIG. 19. Subsequent exemplary processing in accordance with but one aspect of the invention proceeds relative to subsequent processing of the FIG. 19 embodiment in FIG. 20. Two exemplary alternate processings subsequent to FIG. 20 are shown in FIGS. 21 and 22. The alternate embodiment depictions in FIG. 8, FIG. 9, FIG. 12, FIG. 13, FIG. 16, FIG. 17, and FIG. 19 utilize the same numerals for their corresponding figures, with differences being indicated with the suffix "a" or with different numerals. Alternate embodiments are of course contemplated.

Figure 2:
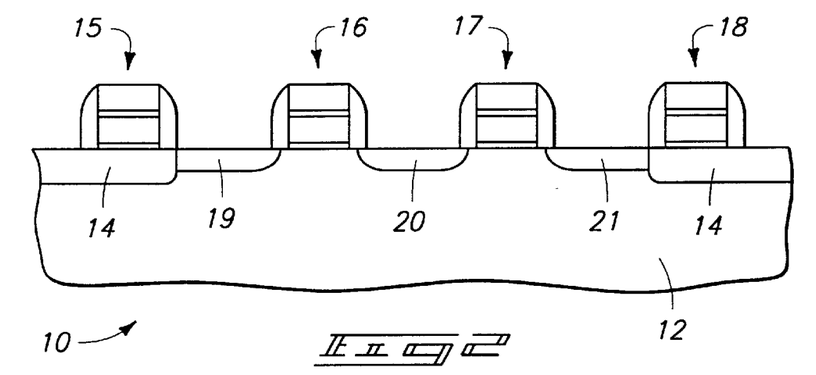
FIG. 2 is a sectional view of FIG. 1 taken through line X2–X3 at one processing step in accordance with an aspect of the invention.
Figure 3:
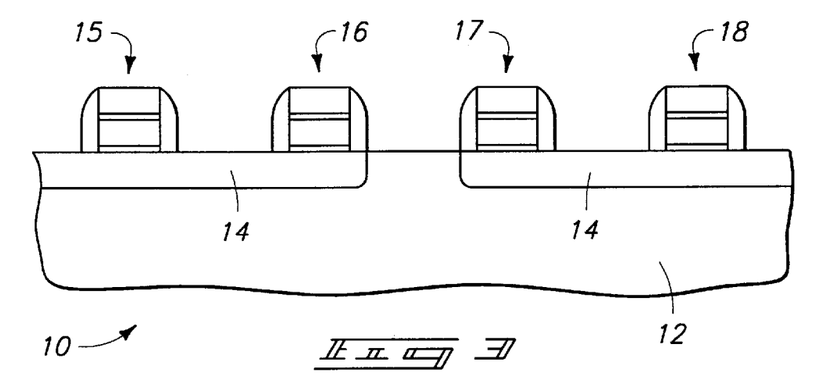
FIG. 3 is a sectional view of FIG. 1 taken through line X1–X4 at the same sequence in processing as FIG. 2.

Referring initially to FIGS. 1–3, a semiconductor wafer fragment is indicated generally with reference numeral 10. Such comprises a bulk monocrystalline silicon substrate 12 and shallow trench field isolation regions 14. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Wafer fragment 10 includes word line constructions 15, 16, 17, and 18. Each is depicted as being comprised of a gate dielectric region, a conductively doped polysilicon region on the gate dielectric region, a conductive silicide region on the polysilicon region, an insulating cap on the silicide region, and insulative anisotropically etched sidewall spacers. Such components are merely exemplary and not depicted with numerals.

A series of source/drain diffusion regions 19, 20 and 21 are received proximate the illustrated word lines. Regions 19 and 21 in the exemplary embodiment will constitute storage node contacts for respective capacitors, while source/drain region 20 will constitute a bit node contact. Accordingly, and by way of example only, word line 16 can be considered as having or being associated with a pair of opposing source/drain regions 19 and 20, and word line construction 17 can be considered as having or being associated with a pair of opposing source/drain regions 20 and 21.

Figure 4:
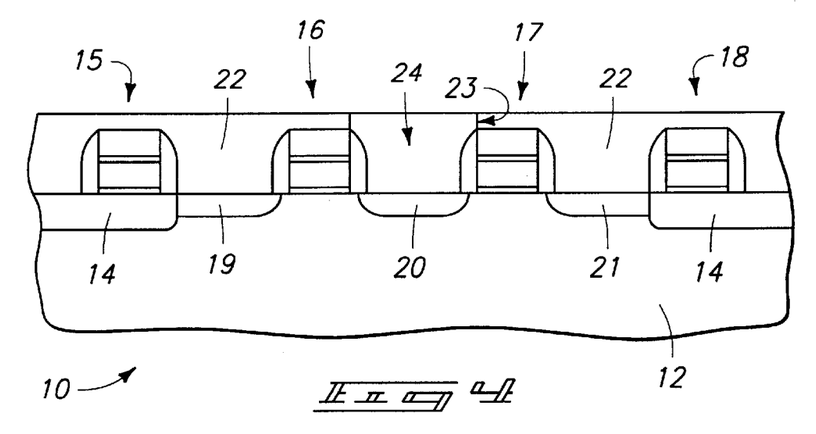
FIG. 4 is a view of the FIG. 2 wafer fragment at a processing step subsequent to that depicted by FIG. 2.
Figure 5:
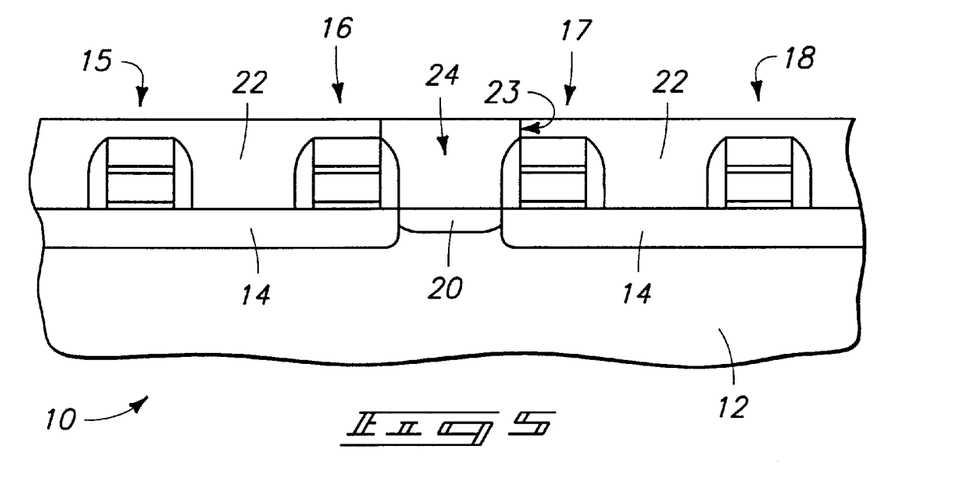
FIG. 5 is a view of the FIG. 3 wafer fragment at a processing is step subsequent to that depicted by FIG. 3 and corresponding in sequence with that depicted by FIG. 4.

Referring to FIGS. 4 and 5, an insulating layer 22 is deposited over the word lines and source/drain regions. A contact opening 23 has been formed therethrough to source/drain region 20, filled with a conductive plugging material 24, and preferably planarized back as shown. An exemplary and preferred material for layer 22 is borophosphosilicate glass (BPSG). Plug 24 preferably comprises conductively doped silicon, and more preferably conductively doped polysilicon. Diffusion barrier layers and/or adhesion layers might also constitute a part of plug 24, if desired. Accordingly, such depicts but one example of forming a polysilicon comprising plug 24 in electrical connection with a source/drain diffusion region 20 through an insulating layer 22. In the context of this particular embodiment, plug 24 can be considered as a silicon comprising region in electrical connection with source/drain region 20.

Figure 6:
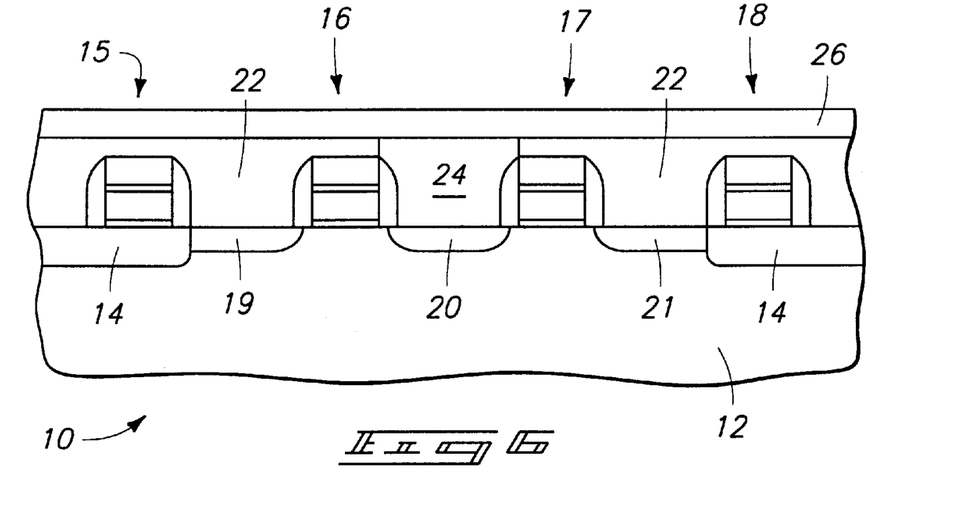
FIG. 6 is a view of the FIG. 4 wafer fragment at a processing step subsequent to that depicted by FIG. 4.
Figure 7:
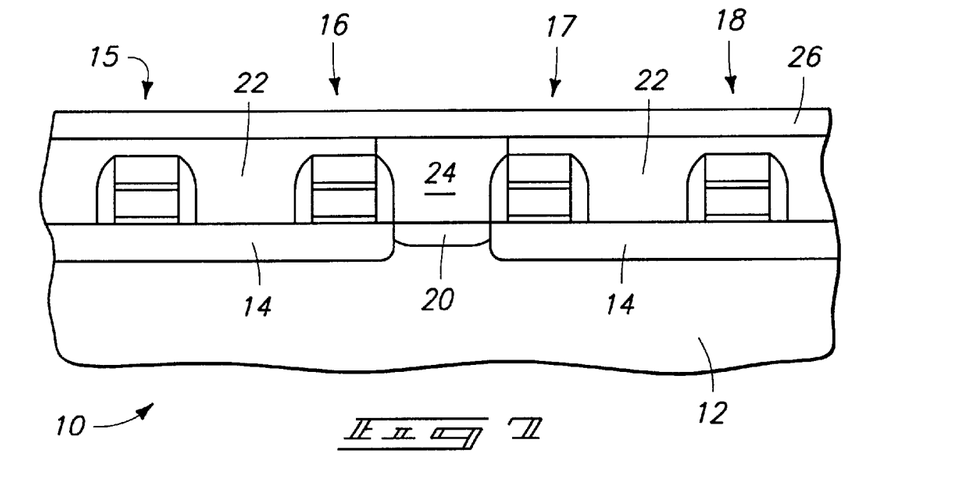
FIG. 7 is a view of the FIG. 5 wafer fragment at a processing step subsequent to that depicted by FIG. 5 and corresponding in sequence to that depicted by FIG. 6.
Figure 23:
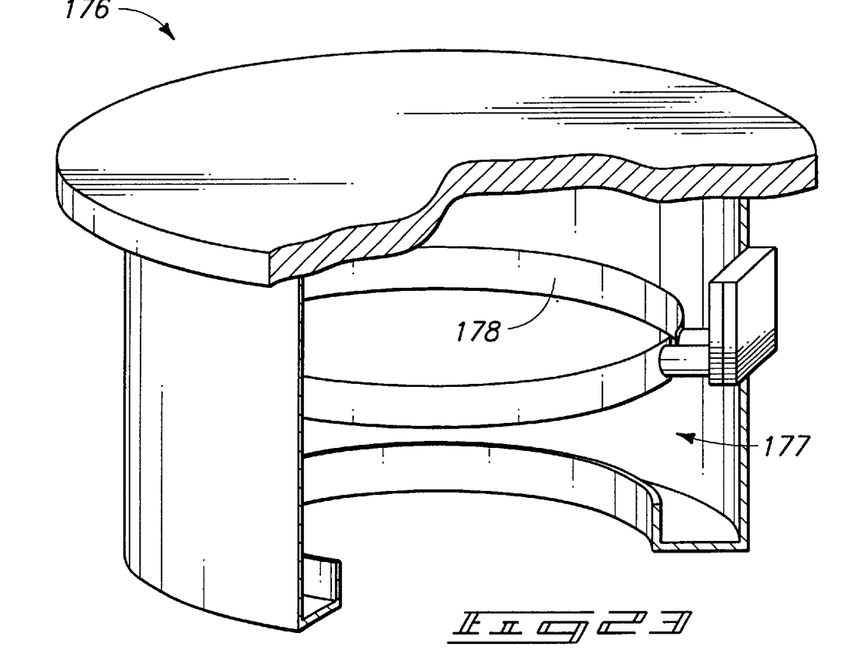
FIG. 23 is a perspective view of a processing reactor, with a portion broken away for clarity, utilizable in accordance with one of the processing steps depicted in other figures.
Figure 24:
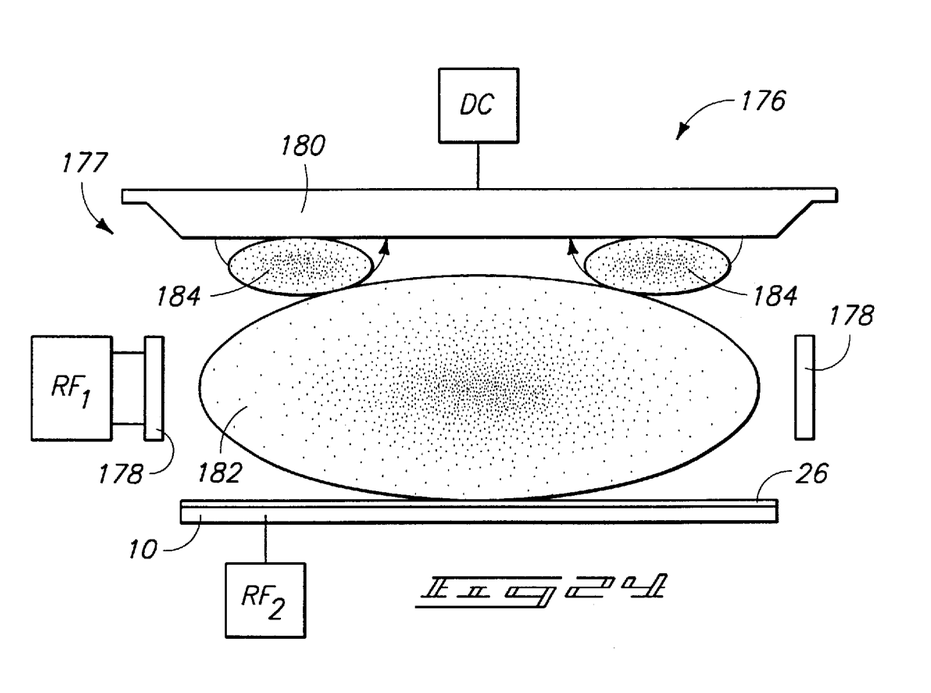
FIG. 24 is an elevational schematic view of one aspect of processing in accordance with a preferred embodiment of the invention.

Referring to FIGS. 6 and 7, an HF preclean dip is preferably conducted before a $TiN_x$ comprising layer 26 is deposited over insulating layer 22 and silicon comprising region/polysilicon comprising plug 24, where "x" is greater than 0 and less than 1. Preferably, x ranges from 0.2 to 0.8, and even more preferably from 0.5 to 0.6. One preferred way of forming the TiN is as described in our co-pending U.S. patent application Ser. No. 09/026,104, filed on Feb. 19, 1998, and entitled "Asymmetric, Double-Sided Self-Aligned Silicide and Method of Forming the Same" having Yongjun Jeff Hu as the inventor. Another preferred method of forming $TiN_x$ layer 26 is shown and described with reference to FIGS. 23 and 24 utilizing a sputter deposition reactor 176. FIG. 23 depicts a broken perspective view of an exemplary process in reactor 176 emphasizing preferred inductive coil positioning, with other reactor components not being depicted for clarity. FIG. 24 diagrammatically depicts operation of the exemplary reactor of FIG. 23 showing target, wafer, inductive coil, and plasma generation as will now be more specifically described.

Sputtering reactor 176 includes an inductive coil 178 mounted within a reactor chamber 177. A preferred sputter deposition system is a Magnatron System available from Applied Materials as an Ion Metal Plasma (IMP) Reactor™. Such is capable of retaining and DC biasing a target 180 and an $RF_2$ biased substrate (FIG. 24), such as for example substrate 10. In a preferred method of forming a layer 26, a nitrogen containing source gas and a sputtering gas are fed to reactor chamber 177. The reactor is operated during such feeding to provide a selected target power, inductive coil power, and substrate bias to deposit $TiN_x$ comprising layer 26 onto substrate 10. Using the IMP reactor, exemplary operable ranges include a substrate bias ($RF_2$) from 0W (neutral) to 1000 W, an inductive coil power ($RF_1$) from 1.0 kW to 5.0 kW, and a target power (DC) of from 1.0 kW to 5.0 kW. A preferred nitrogen containing source gas is $N_2$, with a preferred sputtering gas being a noble gas, such as Ar.

Preferred reactor temperature ranges for the processing as depicted in FIG. 24 are from room temperature to 250° C. for backside temperature, and preferably from about 10 mTorr to about 30 mTorr. Preferred $RF_2$ bias is from 300 W to 500 W. A largely magnatron plasma 184 forms near target 180 for sputtering material therefrom, with inductive coil 178 resulting in formation of a gas plasma 182 therebeneath. A high electric field or self-bias develops in the boundary layer or sheath between the plasma and the substrate which accelerates the metal ions towards the substrate in a vector generally perpendicular to the wafer surface, particularly for increasing $RF_2$ bias values.

In the preferred example, gas plasma 182/184 as generated within reactor chamber 77 extends entirely between at least a portion of target 180 and a portion of substrate 10, resulting in deposition of layer 26 as diagrammatically shown in FIG. 24. A specific example using the IMP reactor comprises a DC target power of 2.0 kW, $RF_1$ at 2.8 kW, $RF_2$ at 0W, with argon and nitrogen flows at 30 and 40 sccm, respectively. A preferred thickness for layer 26 is from 150 Angstroms to 300 Angstroms.

Figure 8:
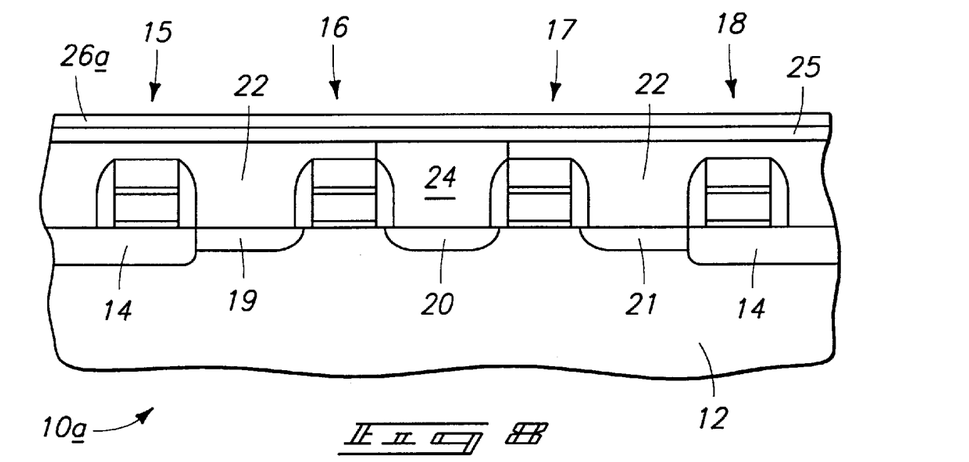
FIG. 8 is an alternate embodiment wafer fragment corresponding in section and sequence to that depicted by FIG. 6.
Figure 9:
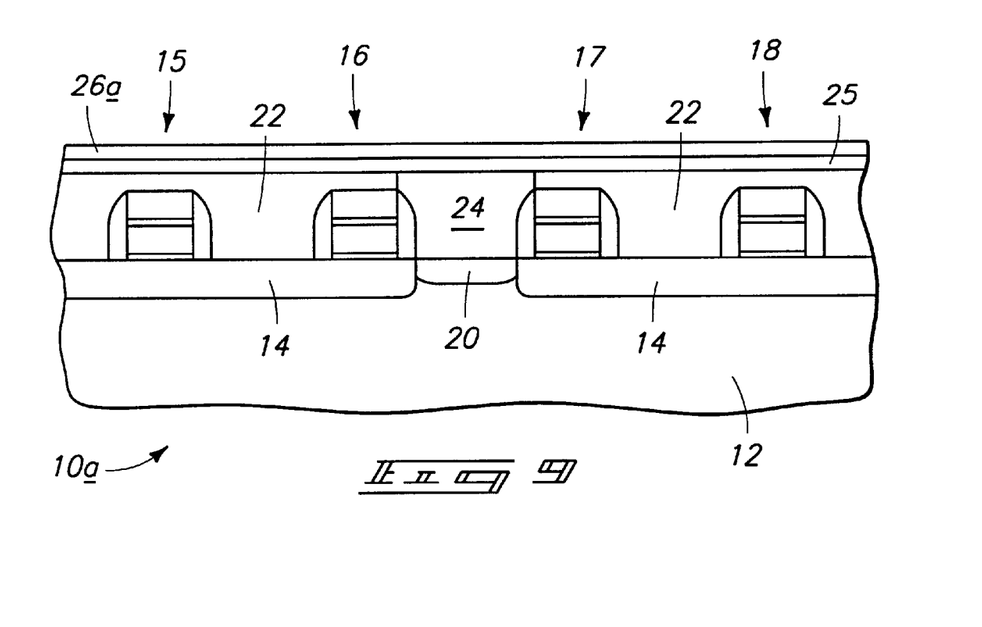
FIG. 9 is a view of the alternate embodiment wafer fragment corresponding in section and sequence to that depicted by FIG. 7.

FIGS. 8 and 9 illustrate alternate exemplary processing in connection with a semiconductor wafer fragment 10a. Wafer fragment 10a differs from that depicted by FIGS. 6 and 7 in deposition of a polysilicon comprising layer 25 over insulating layer 22 and polysilicon comprising plug 24. Accordingly in the FIGS. 8 and 9 depicted embodiment, polysilicon layer 25 and polysilicon plug 24 constitute an exemplary silicon comprising region formed over and in electrical connection with source/drain diffusion region 20. An example thickness for layer 25 is from 500 Angstroms to 1000 Angstroms. Alternately or in addition, the combined thickness of layers 25 and 26a preferably correspond to the total thickness of layer 26 in the FIGS. 6 and 7 embodiment. Further preferably, layers 25 and 26a are deposited to be roughly the same thickness.

Figure 10:
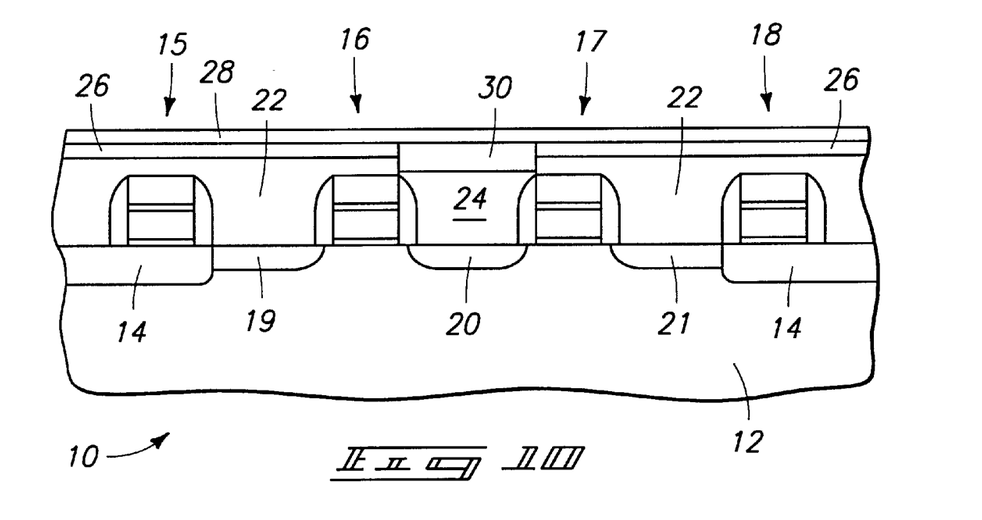
FIG. 10 is a view of the FIG. 6 wafer fragment at a processing step subsequent to that depicted by FIG. 6.
Figure 11:
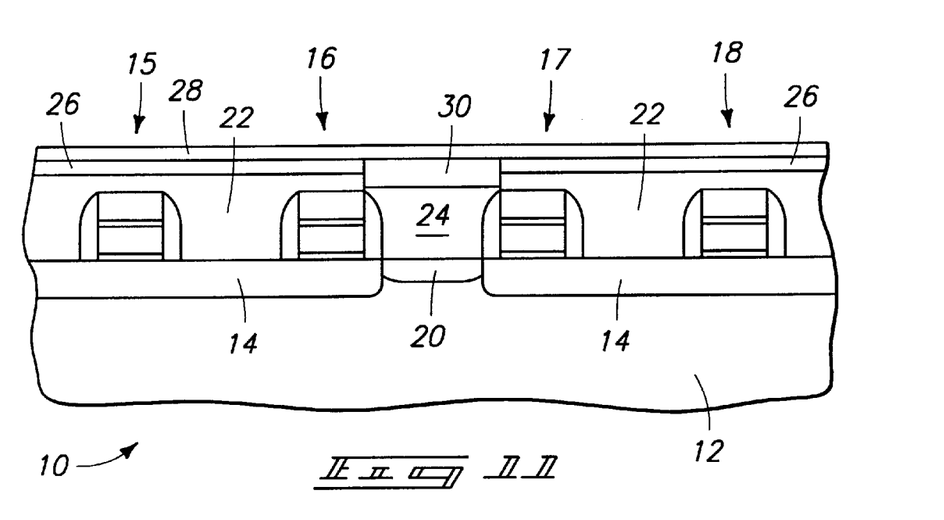
FIG. 11 is a view of the FIG. 7 wafer fragment at a processing step corresponding to that depicted by FIG. 10.

Referring to FIGS. 10 and 11, $TiN_x$ comprising layer 26 in one implementation is annealed in a nitrogen containing atmosphere (with or without plasma) effective to transform at least an outermost portion of $TiN_x$ layer 26 over silicon comprising region 24 to stoichiometric TiN material 28. Further preferably, such annealing is effective to transform at least an outermost portion of polysilicon comprising plug 24 to a silicide material 30 from titanium of the $TiN_x$ comprising layer. Thus, plug 24 now preferably comprises an outermost silicide region 30. Silicide region 30 preferably comprises $TiSi_yN_z$, where "y" is greater than 0 and less than 2, and "z" is less than or equal to 1. The FIGS. 10 and 11 processing also depicts the annealing transforming at least an outermost portion of the $TiN_x$ layer not over silicon comprising region 24 to stoichiometric TiN. Further, FIGS. 10 and 11 depict transformation of only an outermost portion of the $TiN_x$ layer over silicon region 24 to TiN, and only an outermost portion thereof not over silicon comprising region 24 to stoichiometric TiN. In an alternate 1 considered and preferred embodiment, all of the $TiN_x$ layer which is not over plug 24 is transformed to stoichiometric TiN, with some stoichiometric TiN remaining over silicide region 30.

Preferred nitrogen containing atmospheres during annealing comprise at least one of $N_2$ and $NH_3$. The annealing preferably comprises rapid thermal processing (RTP) with a temperature ramp rate of at least 50° C. per second. Regardless, the annealing preferably comprises a temperature of at least 400° C., and more preferably from 400° C. to 750° C. Processing time at the final temperature is preferably from between 20 seconds to 100 seconds. In a reduction to practice example, a temperature of 650° C., for 60 seconds in an $N_2$ comprising atmosphere was utilized. A RTP reduction to practice example is to a temperature from 950° C. to 1000° C.

An example plasma annealing atmosphere comprises nitrogen and hydrogen, for example a combination of $N_2$ and $H_2$, and/or $NH_3$. Example plasma conditions include using an Applied Materials Centura reactor, with plasma power ranging from 100 W to 1500 W, time at from 10 seconds to 240 seconds, temperature at from 300° C. to 550° C., pressure from 10 mTorr to 10 Torr. Exemplary processing with such parameters using both $N_2$ and $H_2$ comprises flow rates for each gas of from 50 sccm to 100 sccm with argon being provided at from 0 sccm to 500 sccm.

Figure 12:
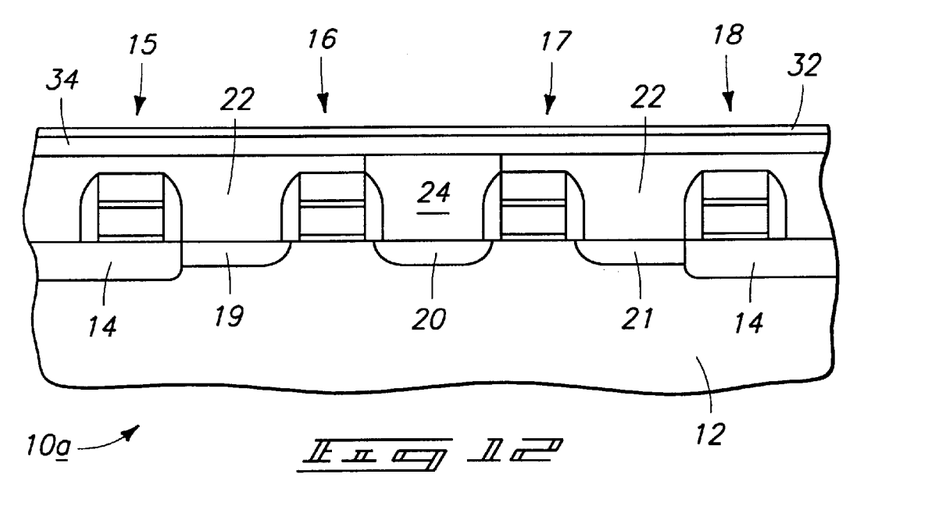
FIG. 12 is a view of the alternate embodiment wafer fragment corresponding in section and sequence to that depicted by FIG. 10.
Figure 13:
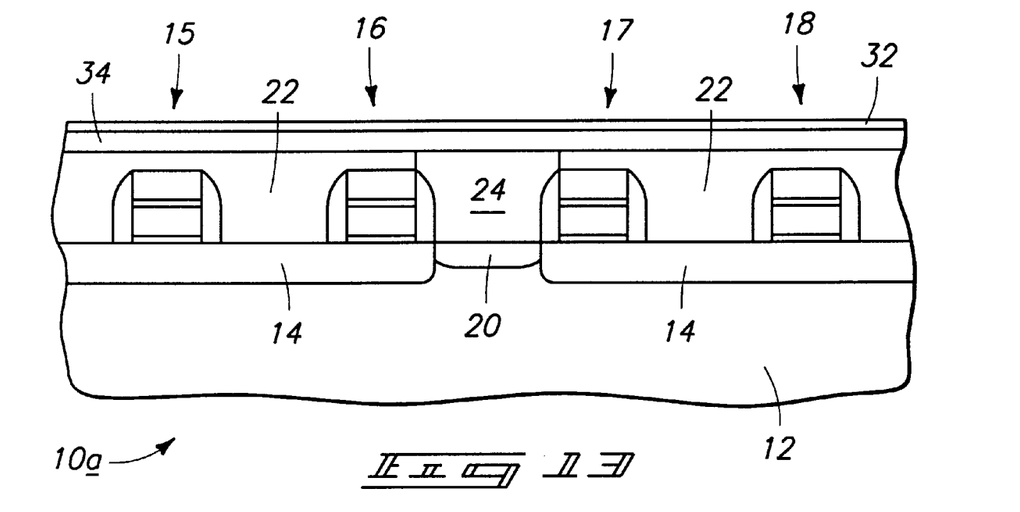
FIG. 13 is a view of the alternate embodiment wafer fragment corresponding in section and sequence to that depicted by FIG. 11.

FIGS. 12 and 13 illustrate but one exemplary annealing processing which might occur with respect to the alternate substrate 10a embodiment. The same preferred annealing shows $TiN_x$ layer 26a (FIGS. 8 and 9) and polysilicon layer 25 (FIGS. 8 and 9) having been transformed to an outermost stoichiometric TiN layer 32 (FIGS. 12 and 13) and an innermost silicide layer 34 (FIGS. 12 and 13) preferably of the composition as described above. In accordance with an aspect of the alternate embodiment, the annealing transforms at least an outermost portion of the $TiN_x$ layer to TiN and reacts at least an innermost portion of the $TiN_x$ layer with polysilicon of polysilicon comprising layer 25 to form a silicide. Alternately and by way of example only, an intermediate $TiN_x$ layer or region might also remain (not shown). Further alternately and by way of example only, only an outer portion of polysilicon comprising layer 25 might be converted to a silicide, leaving an inner portion comprising polysilicon (not shown).

Figure 14:
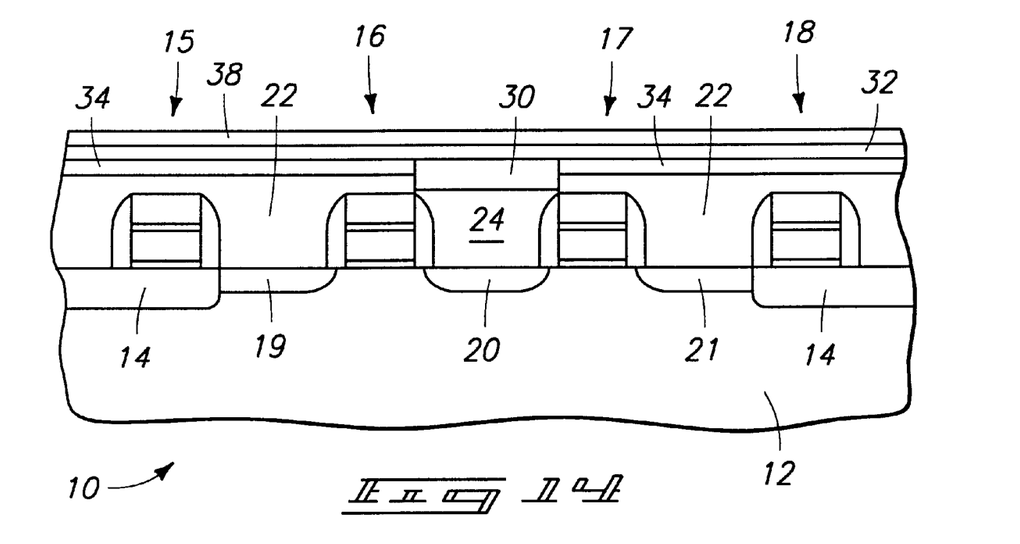
FIG. 14 is a view of the FIG. 10 wafer fragment at a processing step subsequent to that depicted by FIG. 10.
Figure 15:
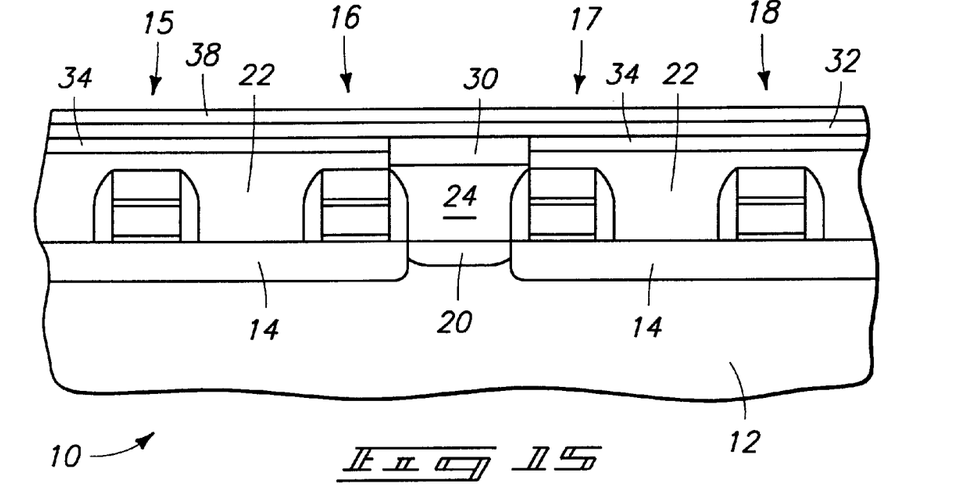
FIG. 15 is a view of the FIG. 11 wafer fragment at a processing step subsequent to that depicted by FIG. 11 and corresponding to that depicted by FIG. 14.

Referring to FIGS. 14 and 15, and after the annealing, an elemental tungsten comprising layer 38 (i.e., either tungsten or an alloy of tungsten) is formed on the TiN. Such might occur by conventional chemical vapor deposition, plasma enhanced chemical vapor deposition, physical vapor deposition or by other methods. An exemplary thickness is from 300 Angstroms to 500 Angstroms. In accordance with a preferred aspect of the invention, the above described annealing is conducted in situ in a chamber within which the elemental tungsten comprising layer is also formed by a deposition. An example and preferred thickness for layer 38 is from 300 Angstroms to 500 Angstroms.

Figure 16:
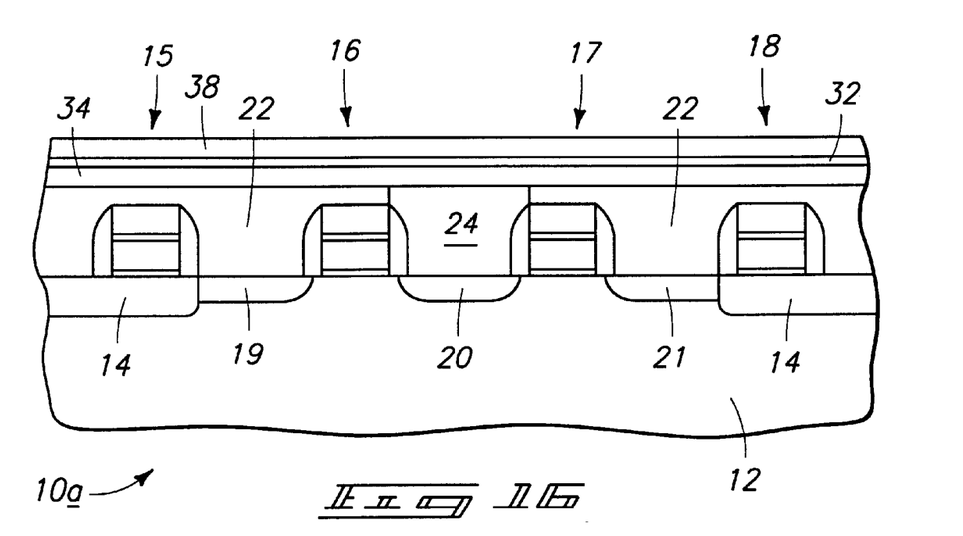
FIG. 16 is a view of the alternate embodiment wafer fragment corresponding in section and sequence to that depicted by FIG. 14.
Figure 17:
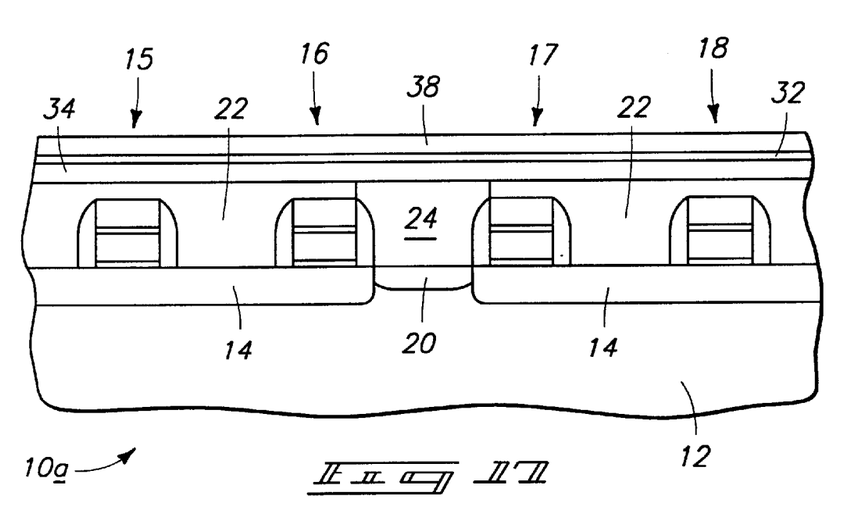
FIG. 17 is a view of the alternate embodiment wafer fragment corresponding in section and sequence to that depicted by FIG. 15.

FIGS. 16 and 17 depict a layer 38 deposition in accordance with the alternate embodiment wafer fragment 10a.

Figure 18:
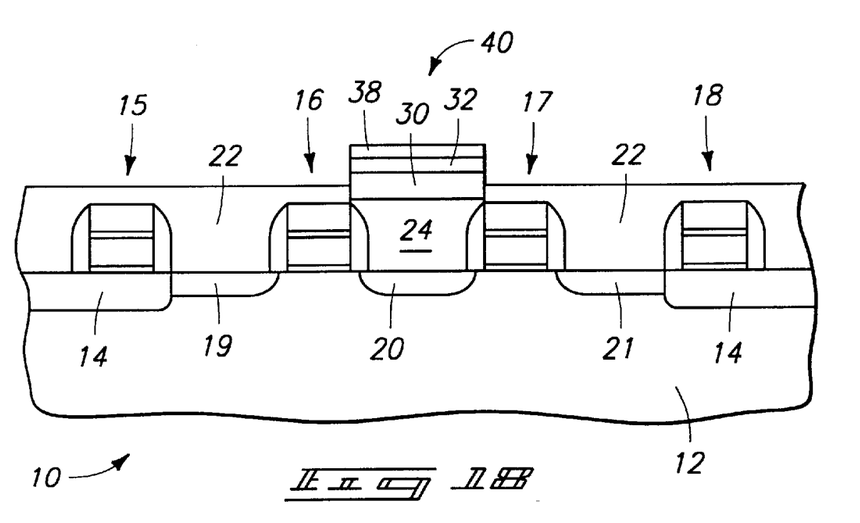
FIG. 18 is a view of the FIG. 14 wafer fragment at a processing step subsequent to that depicted by FIG. 14.

Referring to FIGS. 1 and 18, elemental tungsten comprising layer 38, TiN layer 32, and any remaining $TiN_x$ layer have been patterned, preferably using photoresist and photolithography, into a bit line 40 which is in electrical connection with source/drain region 20. FIG. 19 depicts alternate corresponding processing in the fabrication of a bit line 40a whereby the elemental tungsten comprising layer, the TiN, the silicide and any remaining of the polysilicon comprising layer have been patterned into a bit line 40a in electrical connection with source/drain diffusion region 20. The X1–X4 section view (taken from FIG. 1) of the process corresponding to that of FIG. 18 would be the same as shown in FIG. 15. Likewise, the X2–X3 section view (taken from FIG. 1) of the process corresponding to that of FIG. 19 would be the same as shown in FIG. 17. Accordingly, FIG. 18 depicts buried bit line memory circuitry wherein a bit line 40 is received over insulating layer 22 and contacts outermost silicide region 30 of plug 24, and comprises a TiN region and an outer elemental tungsten comprising region. Further, FIG. 19 depicts bit line 40a comprising an inner silicide region, a TiN comprising mid region, and an outer elemental tungsten comprising region. Further, word line 40 in FIGS. 15 and 18 depict but one exemplary bit line comprising a TiN region and an outer elemental tungsten comprising region.

Referring to FIG. 20, an insulating layer 44 (i.e., planarized BPSG) is formed over bit line 40a and remaining portions of substrate 10a. Storage node/capacitor contacts 46 and 48 are made therethrough and through insulating layer 22 to source/drain regions 19 and 21, respectively.

Alternate exemplary processing for fabrication of capacitor structures are shown with respect. to FIGS. 21 and 22. Specifically, FIG. 21 depicts fabrication of capacitors 50 and 52 relative to storage node openings 46 and 48. Such could be formed, by example only, by deposition of a storage node layer 54 which is planarized back relative to layer 44 to provide desired isolated storage nodes. A suitable capacitor dielectric layer 56 and cell capacitor plate layer 58 could then be deposited thereover.

FIG. 22 depicts plugging of storage node openings 46 and 48 with a conductive plugging material 59. Then, another insulating layer 60, (i.e., BPSG) is formed over the substrate, and container openings 64 are provided therein. A storage node layer 54, capacitor dielectric layer 56 and cell plate layer 58 could then be subsequently formed as shown to produce capacitors 51 and 53. Regardless, both such embodiments depict formation of a capacitor received at least partially outward of the bit line and in electrical connection with one of source/drain regions 19 and 21.

The processing and circuitry was described with respect to DRAM circuitry. However, other memory circuitry and other circuitry are also contemplated. For and by way of example only, the processing includes formation of a conductive line which might be other than a bit line.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method of forming a conductive line comprising:

forming a silicon comprising region over a substrate;

depositing a $TiN_x$ comprising layer over the silicon comprising region, where "x" is greater than 0 and less than 1;

annealing the $TiN_x$ comprising layer in a nitrogen containing atmosphere effective to transform at least an outermost portion of the $TiN_x$ layer over the silicon comprising region to TiN;

after the annealing, depositing an elemental tungsten comprising layer on the TiN and patterning at least the elemental tungsten comprising layer, the TiN, and any remaining $TiN_x$ layer into conductive line.

2. The method of claim 1 wherein the annealing reacts an innermost portion of the $TiN_x$ layer with silicon of the silicon comprising region to form a silicide.

3. The method of claim 2 wherein the silicide comprises $TiSi_yN_z$, where "y" is greater than 0 and less than 2, and "z" is less than or equal to 1.

4. The method of claim 1 wherein the annealing transforms at least an outermost portion of the $TiN_x$ layer not over the silicon comprising region to TiN.

5. The method of claim 1 wherein the annealing transforms only an outermost portion of the $TiN_x$ comprising layer over the silicon region to TiN, and at least an outermost portion of the $TiN_x$ layer not over the silicon comprising region to TiN.

6. The method of claim 1 wherein "x" ranges from 0.2 to 0.8.

7. The method of claim 1 wherein the annealing is conducted in situ in a chamber within which the elemental tungsten comprising layer is formed by depositing.

* * * * *

UNITED STATES PATENT AND TRADEMARK OFFICE
CERTIFICATE OF CORRECTION

PATENT NO. : 6,368,962 B2  
DATED : April 9, 2002  
INVENTOR(S) : Yongjun Jeff Hu et al.

It is certified that error appears in the above-identified patent and that said Letters Patent is hereby corrected as shown below:

Title page,
Item [56], References Cited, replace "5,760,476" with -- 5,760,475 --
Replace "U.S. application No. 09/454,828," with -- U.S. application No. 09/454,826, --
Item [57], ABSTRACT,
Line 19, replace "cated by is the above and other methods." with -- cated by the above and other methods. --

Column 2,
Line 17, FIG. 5, replace "processing is step subsequent to that" with -- processing step subsequent to that --

Column 4,
Line 20, replace "of forming the TiN is as described" with -- of forming the $TiN_x$ is as described --

Column 5,
Line 38, replace "In an alternate 1 considered and" with -- In an alternate considered and --

Column 6,
Line 55, replace "comprising a TiN region and an outer" with -- comprising a $TiN_x$ region and an outer --

Signed and Sealed this

Seventeenth Day of December, 2002

JAMES E. ROGAN  
*Director of the United States Patent and Trademark Office*